United States Patent [19]
Checki, Jr. et al.

[11] 3,978,579
[45] Sept. 7, 1976

[54] AUTOMATIC ASSEMBLY OF SEMICONDUCTOR DEVICES

[75] Inventors: Angelo Daniel Checki, Jr., Lyndhurst; Anton Griswold Frey, Basking Ridge, both of N.J.

[73] Assignee: RCA Corporation, New York, N.Y.

[22] Filed: Aug. 30, 1974

[21] Appl. No.: 501,965

[52] U.S. Cl. ............................................... 29/589
[51] Int. Cl.² ........................................ B01J 17/00
[58] Field of Search ............. 29/589, 203 P, 203 R, 29/464, 576 S

[56] References Cited
UNITED STATES PATENTS

| | | | |
|---|---|---|---|
| 3,151,387 | 10/1964 | Clemens et al. | 29/203 P |
| 3,226,810 | 1/1966 | Beliveau | 29/203 P |
| 3,390,450 | 7/1968 | Checki, Jr. et al. | 29/589 |
| 3,564,568 | 2/1971 | Bunner | 29/203 P X |
| 3,689,985 | 9/1972 | Nier | 29/589 X |

*Primary Examiner*—Roy Lake
*Assistant Examiner*—James W. Davie
*Attorney, Agent, or Firm*—H. Christoffersen; R. P. Williams

[57] ABSTRACT

The leads of a stem are first formed or bent to accurately position them relative to a pedestal of the stem, the pedestal being that portion of the stem on which a semiconductor pellet is to be mounted. The formed leads are thereafter used as a means for accurately locating the stem at a parts assembling work station at which a pellet is disposed on the pedestal in preselected positional relation with the leads and contacts are disposed on the leads and pressed into engagement with the pellet.

2 Claims, 10 Drawing Figures

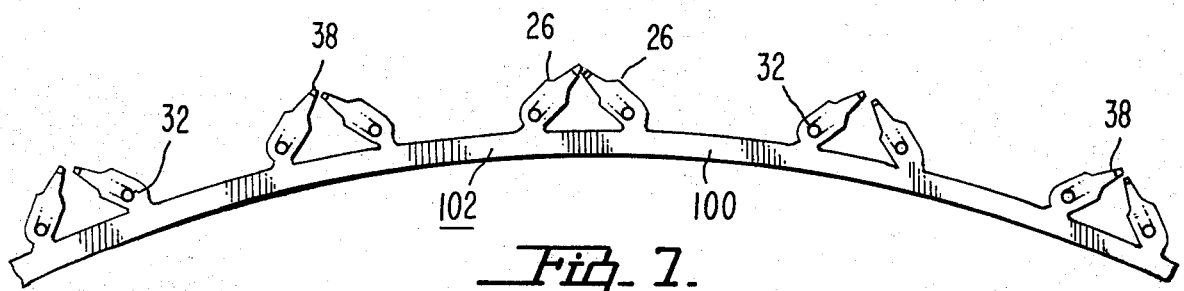
_Fig. 7._
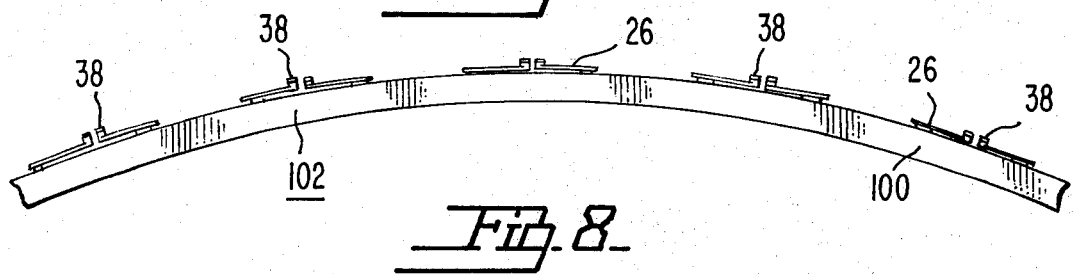
_Fig. 8._
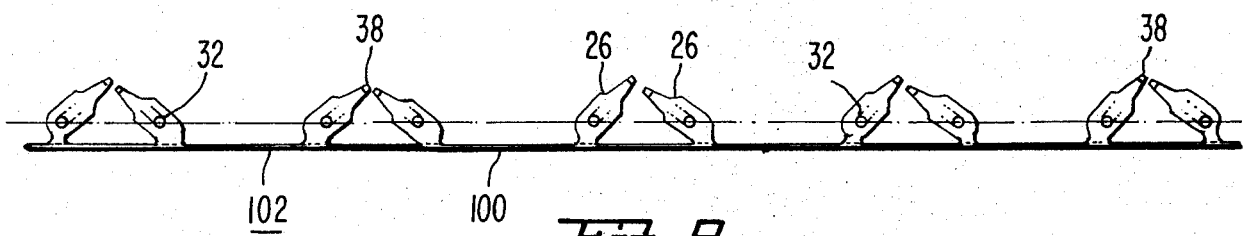
_Fig. 9._
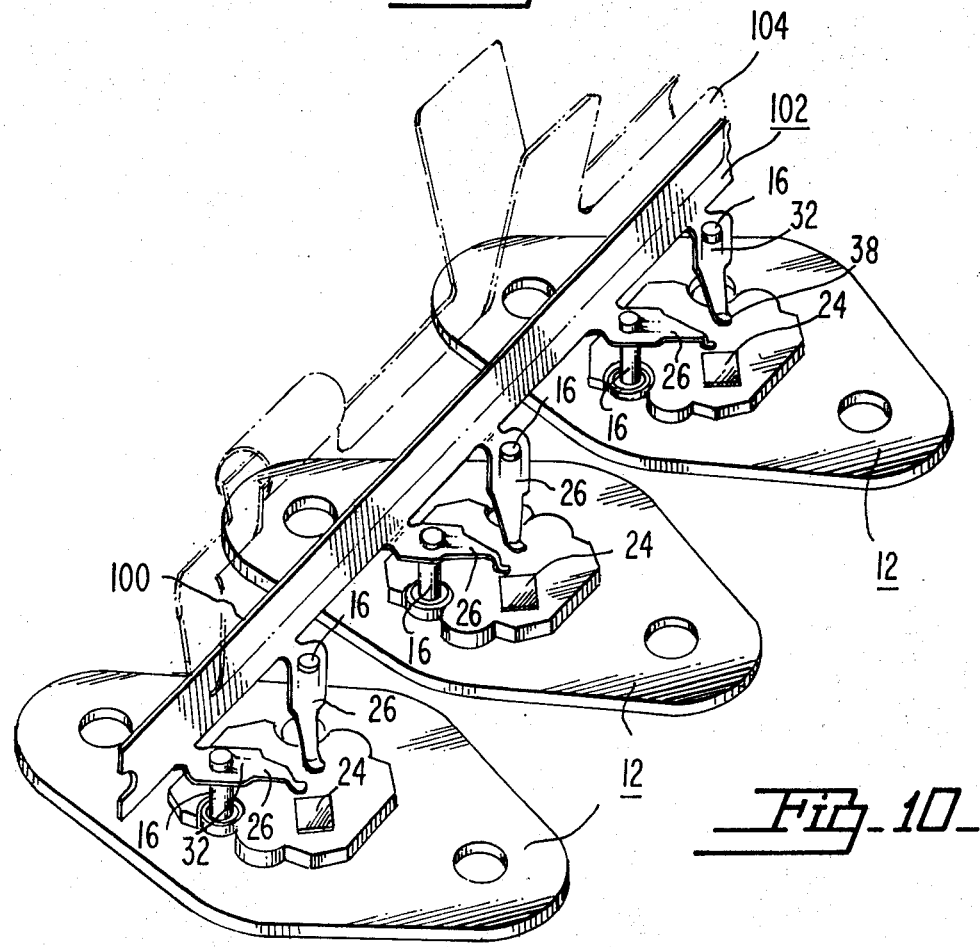
_Fig. 10._

AUTOMATIC ASSEMBLY OF SEMICONDUCTOR DEVICES

This invention relates to the fabrication of semiconductor devices, and particularly to "automatic" or machine assembly of mount assemblies of semiconductor devices.

One known type of semiconductor device comprises an envelope including a mount assembly comprising a flat header having a number of leads extending therethrough, a semiconductor pellet mounted on the header, and sheet metal electrical contacts extending between and bonded to the leads and various surface portions of the pellet.

Heretofore, the steps of disposing the pellet on the header and mounting the contacts on the leads and in contact with the pellet were done either entirely by hand or with the use of simple jigs, an example of the latter being shown in U.S. Pat. No. 3,390,450, issued July 2, 1968, and assigned to the RCA Corporation.

An object of this invention is to provide means for automating or machine performing these pellet and contact assembly steps.

FIG. 7 is a view of an assembly of parts used according to the instant invention to assemble the mount shown in FIG. 1.

FIG. 8 is a side view of the assembly shown in FIG. 7 after portions of the assembly are bent at right angles to other portions thereof.

FIG. 9 is a plan view of the assembly shown in FIG. 8.

FIG. 10 is a view in perspective showing the mounting of portions of the assembly shown in FIGS. 8 and 9 on stem workpieces to complete the mount shown in FIG. 1.

Figure 1:
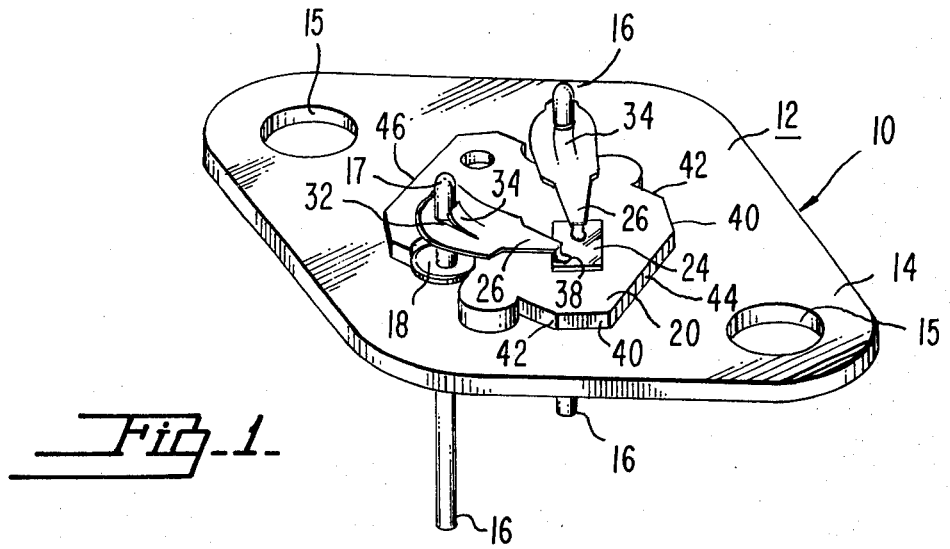
FIG. 1 is a view, in perspective, of a semiconductor mount of the type made according to this invention.

With reference to FIG. 1, a transistor mount 10 is shown comprising a stem 12 including a flat header 14 having two openings 15 therethrough and two leads 16 hermetically sealed through the header 14 by means of glass seals 18, the leads 16 preferably having rounded upper ends 17. Integral with the header 14 is a pedestal 20 serving as a heat sink for a semiconductor pellet 24 mounted thereon. Two contacts 26 extend between each lead 16 and a different surface portion of the pellet 24. One end of each of the contacts 26 has an aperture 32 therethrough and an extending flexed tongue 34 extending into the aperture 32 locking the contact onto a lead. The other end of each of the contacts 26 has a dependent tip 38 bonded to the pellet surface.

Although not shown, a completed transistor is provided by hermetically enclosing the mount 10 in a known type enclosure or can.

The mount parts described are bonded to one another by means of soldered joints. To this end, prior to assembly of the mount, the bottom and selected portions of the top surface of the pellet 24 are provided with a coating of solder, and the contacts 26 are solder clad, as by known means.

The mount 10 is generally of known type and materials, and the various parts thereof can be made according to known processes. In comparison with known mount assemblies, however, one structural modification is preferably made in the stem 12 to more readily accommodate it to the apparatus used in the herein described embodiment of the invention. While facilitating practice of the invention, this modification is not essential.

The stem modification comprises providing the stem pedestal 20, which is normally four-sided, with at least two additional corner sides 40 which are each disposed diagonally between the pedestal sides 42 and 44, the sides 40 being accurately shaped and dimensioned with respect to a flat side 46 of the pedestal at the opposite end thereof.

Figure 2:
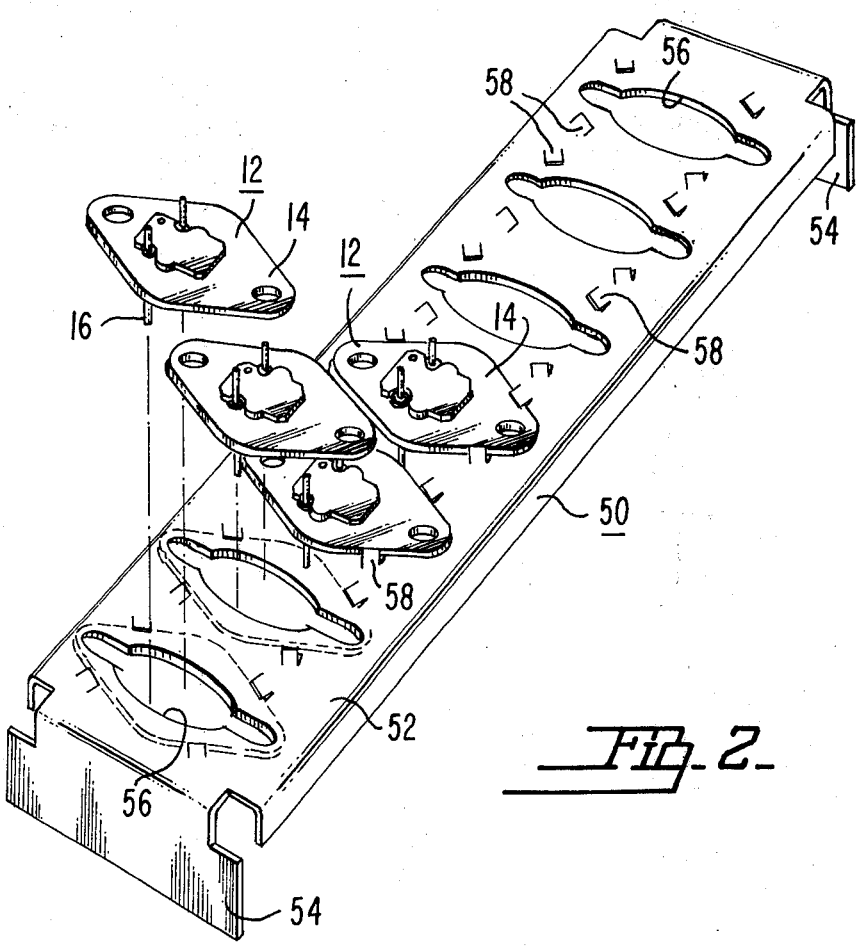
FIG. 2 is a view, in perspective, of a jig used in the practice of the instant invention.

In the practice of the invention, the starting workpiece is the stem 12, the fabrication of such stems being known. A number of the stems 12, e.g., seven, are first loaded, by hand, on a jig 50. As shown in FIG. 2, the jig 50 comprises a plate 52 mounted on a pair of legs 54, the plate 52 having a number of openings 56 each of which is designed to receive a stem 12 partially therethrough. Disposed about each opening 56 are four tabs 58 struck out of the material of the plate 52. The dimensions of the jig 50 are such that the leads 16 of a stem 12 pass freely through each opening 56, while the stem header 14 rests on the jig plate 52 with the sides of the header loosely confined between the tabs 58, the jig 50 thus allowing a substantial amount of lateral movement of the stems thereon.

After loading of the jig 50, a first process comprises reshaping the leads 16, where necessary, for accurately positioning the leads of each stem with respect to the pedestal 20 thereof. This step is necessary because a lead-to-pedestal positioning tolerance is required in the practice of this invention which is tighter than is generally achievable with known stem fabricating processes.

Figure 3:
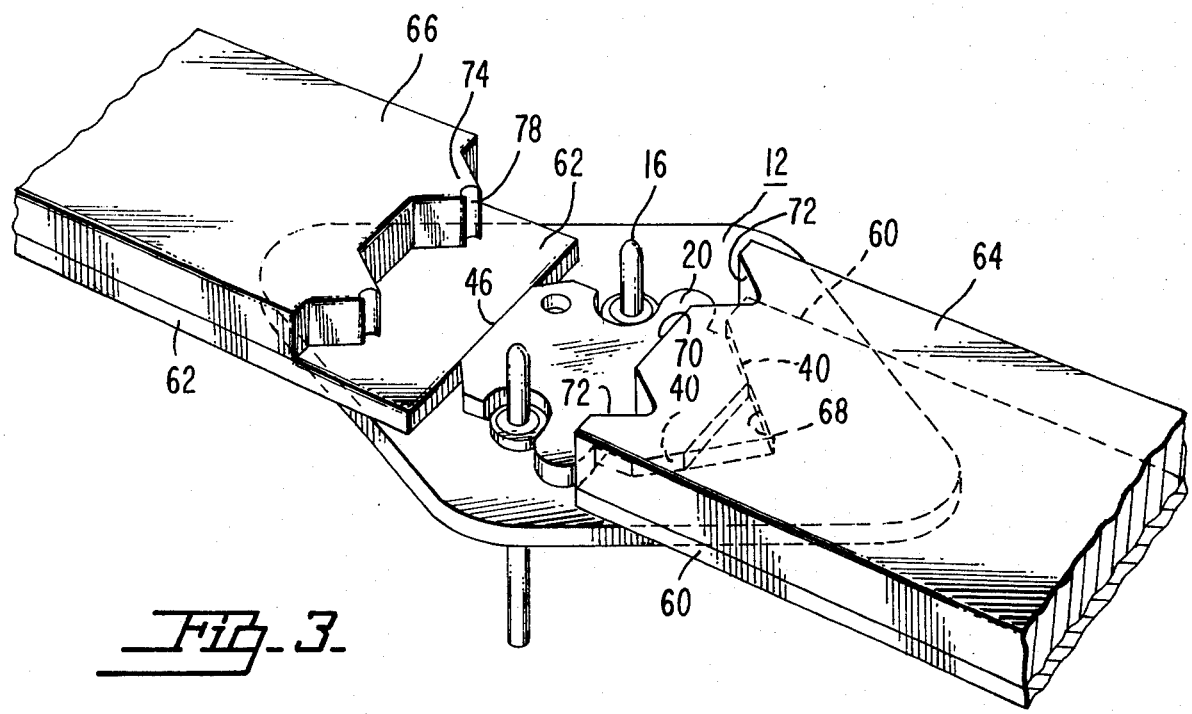
FIG. 3 is a view, in perspective, of a portion of an operating station of an apparatus, one set of operating tools at this station being shown in retracted position.
Figure 4:
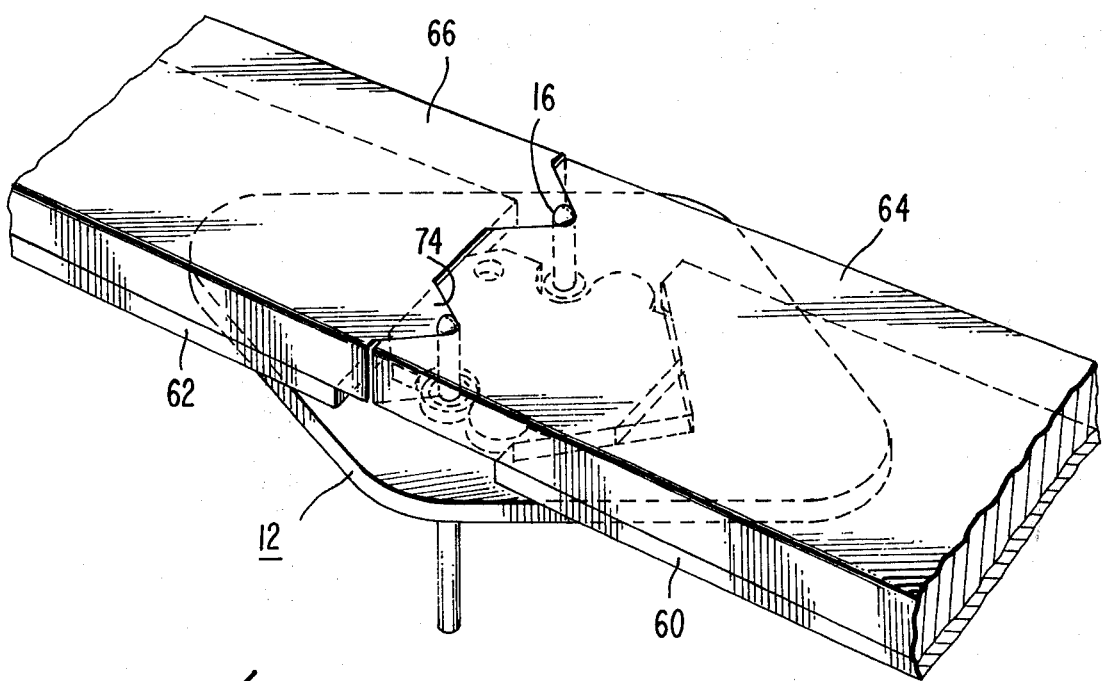
FIG. 4 is a view similar to that of FIG. 3 but showing the one set of operating tools in advanced, operating position.

To achieve this lead positioning, the loaded jig 50 is disposed at an apparatus including a plurality of identical stations corresponding in number to the number of stems on the jig, all the stems thus being simultaneously operated on by the apparatus. FIGS. 3 and 4 show a portion of one of the stations of the lead positioning apparatus, such portion including a pair of jaws 60 and 62 (FIG. 3) for accurately positioning a stem 12 relative to the station, and a pair of jaws 64 and 66 for reshaping, as necessary, the leads 16 of each stem.

It is noted that the art of positioning one or more workpieces at a workpiece operating station and for actuating tools towards and into engagement with the workpieces is quite old and well developed. Because of this, various details of the various apparatus used in the practice of this invention, including means for supporting the jig 50 in relatively accurate relationship with the apparatus, and means for advancing and retracting various tools of the apparatus are not described, the provision of such means being well within the ability of persons skilled in this art.

Returning to the lead shaping process, the function of the jaws 60 and 62 (FIG. 3) is to engage the sides 40 and 46, respectively, of the stem pedestal 20 for accurately positioning the stem 12 at the lead shaping station. As shown, the leading edge of the jaw 62 is flat for engagement with the flat side 46 of the pedestal 20, while the leading edge of the jaw 60 contains a V-notch 68 for engagement with the diagonal sides 40 of the pedestal. In operation, the two jaws 60 and 62 are advanced into contact with sides of the stem pedestal 20, the jaw 62 providing a stop for positioning the stem 12 in one lateral direction, and the sides of the V-shaped notch 68 positioning the stem in the other lateral direction. Owing to the loose mounting of the stem 12 on the jig 50 (not shown in FIG. 3) the stem is freely positionable by the jaws.

To prevent jamming of the apparatus, and to accommodate pedestal dimensional variations from stem to stem, one of the jaws is advanced by means of a force applied through a force limiting means, e.g., a compressive spring or an air cylinder piston (not shown).

Having accurately positioned the stem, the jaws 64 and 66, which up to now have been in retracted position, are actuated. As shown in FIG. 3, the leading edge 70 of the jaw 64 contains a pair of V-shaped notches 72 and the jaw 64 has a thickness equal to about ⅔ of the length of the leads above the header 14. The other jaw 66, of substantially the same thickness as the jaw 64, is provided with a pair of V-shaped fingers 74, the leading edges thereof including a circular bottomed groove 78, and the fingers 76 being shaped and dimensioned to mate with the V-shaped notches 72 in the jaw 64.

In operation, the two jaws 64 and 66 are simultaneously advanced, the leads 16 first (generally) being engaged within the wide mouth notches 72 of the jaw 64 and moved towards the apex of each notch, and the leads 16 then being firmly pressed into the notch apices by the fingers 74 of the jaw 66.

The leads 16 are actually hammered between the two jaws 64 and 66, the material of the leads thus being overstressed to mold them to the shape and location established by the mating jaws 64 and 66. As a result of this process, the leads 16 are accurately positioned relative to the stem pedestal 20, the upper portions of the leads 16 also being disposed in vertical alignment relative to the top surface of the pedestal 20 to facilitate, as described below, the mounting of the contacts 26 on the leads.

While a particular means has been described for shaping and positioning the leads, it is noted that stem lead shaping is a known art, and other known means can be used.

The jig 50 is then disposed at an apparatus a function of which is to provide means for guiding a pellet 24 into accurate position on the stem pedestal 20 and for maintaining the pellet in such position until the contacts 26 are disposed on the workpiece.

Figure 5:
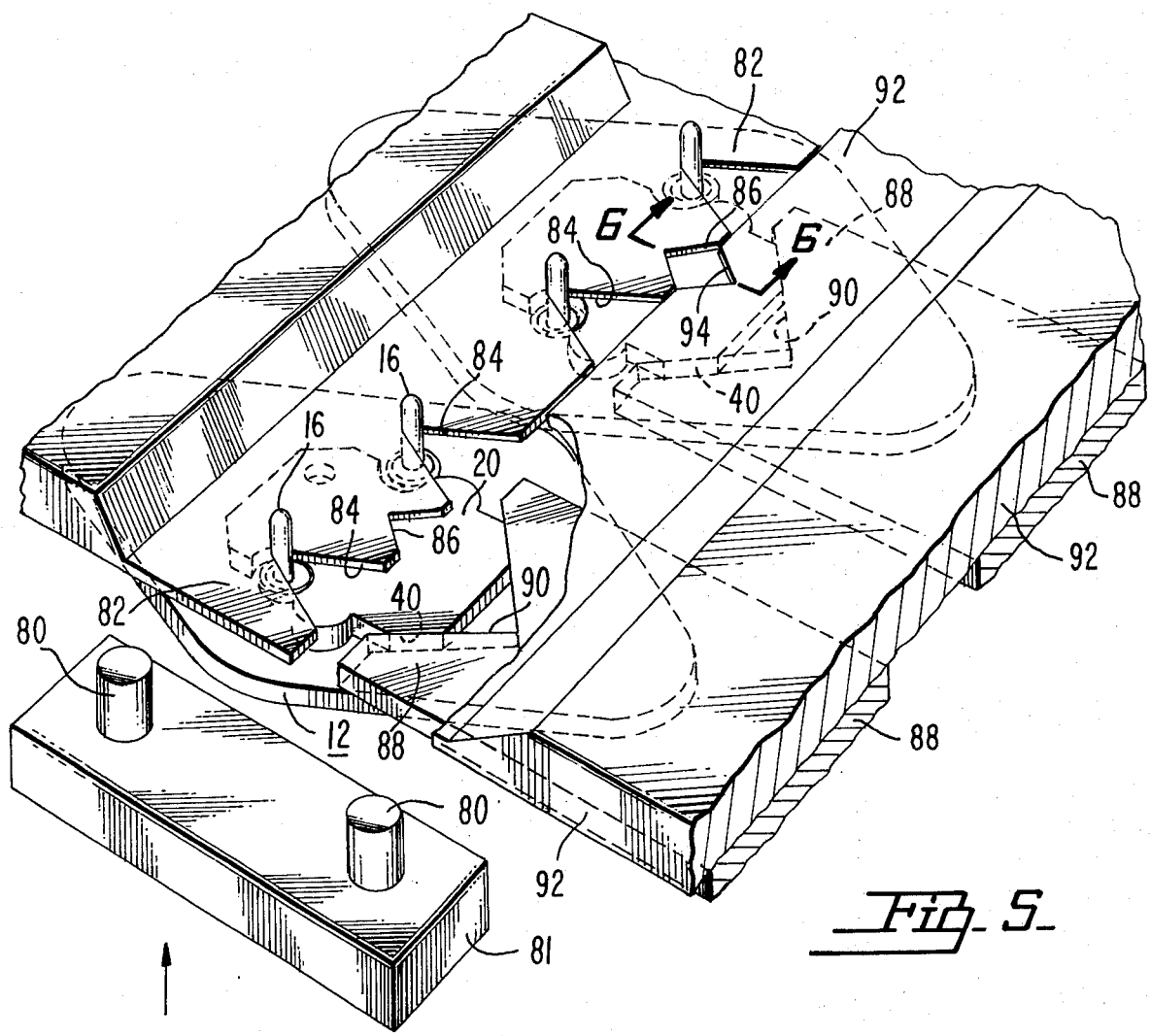
FIG. 5 is a view, in perspective and partly broken-away, of another operating station of the apparatus.

A portion of this apparatus, including two stem operating stations is shown in FIG. 5, each station including a pair of stem lifting rods 80 (only one pair shown) mounted on a vertically moveable plate 81, a first movable plate 82 having a pair of generally V-shaped lead positioning notches 84 disposed on either side of a third V-shaped notch 86; a second movable plate 88 having a notch 90 for engaging the pedestal 20, and a third movable plate 92 having a pellet guiding V-shaped notch 94 in its leading edge. As shown, the plates 82 and 92 are coplanar, and the plate 88 is disposed beneath the plate 92.

Figure 6:
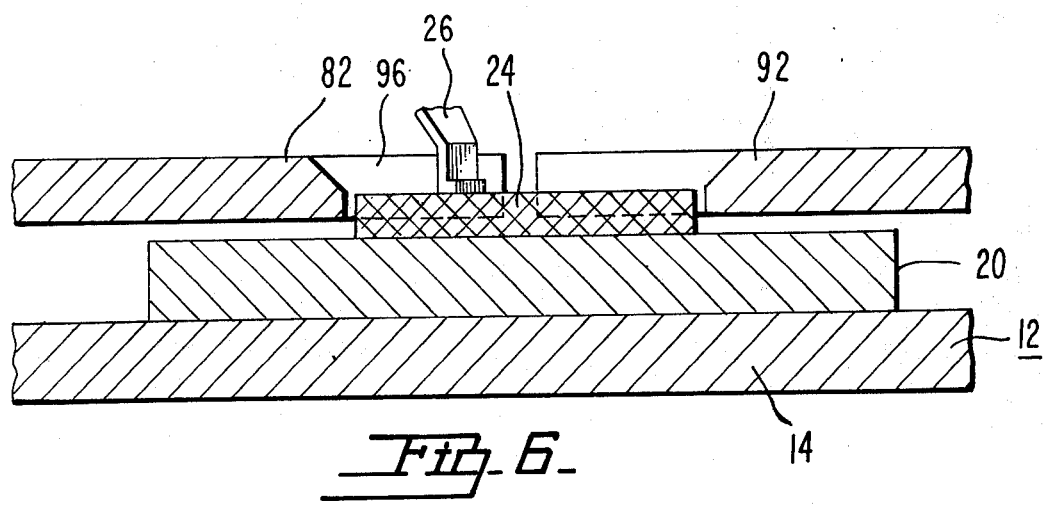
FIG. 6 is a cross-sectional view, on an enlarged scale, along line 6—6 of FIG. 5.

In operation, with all the plates in retracted position, the jig 50 is disposed at this apparatus in such position to dispose the stem leads 16 of each jig in general alignment with the notches 84 in the first plate 82. This plate is then advanced to engage the stem leads 16 within the plate notches 84. The second movable plate 88 is then advanced (by a force applied through, e.g., a compressive spring) into contact with the sides 40 of the stem pedestal to firmly seat the leads 16 at the apices of the two notches 84 to thus accurately position the stem pedestal 20 relative to the apparatus. The third movable plate 92 is then advanced so that the V-notch 94 therein cooperates with the V-notch 86 in the plate 82 to form a guide or chute 96 (FIG. 6). The walls of the V-notches 86 and 94 are beveled so that the chute 96 has beveled inner walls. The rods 80 (FIG. 5) are then raised through the jig openings 26 (the jig 50 not being shown in FIG. 5) to engage and lift the stem header 14 to thus position the stem pedestal 20 closely adjacent to (FIG. 6) the undersides of the plates 82 and 92 and directly beneath the chute 96.

A pellet 24 (FIG. 6) is then disposed, either by hand or, preferably, by a known type of vacuum pick-up tool, within the open end of the chute 96 and thus in preselected position on the stem pedestal 20, the chute 96 maintaining the pellet 24 in position after the pellet disposing means is removed.

The last step in the process is to dispose a contact 26 on each lead 16 and in contact with the pellet 24, the contacts 26 serving as flexed springs clamping the pellet against the pedestal until the pellet is soldered to the pedestal 20 and contacts 26 in a later operation.

The contact disposing process is preferably done automatically, and to this end, a plurality of pairs of contacts 26, one pair for each stem 12 on the jig 50, are provided connected to an elongated strip 100 (FIG. 7) of a contact assembly 102. The spacing between each pair of contacts 26 along the strip 100 corresponds to the spacing between the various stems 12 on the jig 50, and the dimensions and relative angles of the contacts 26 of each contact pair correspond to the positional relationship between the leads 16 and the pellet 24 as determined by the various positioning plates 82, 88 and 92 as shown in FIG. 5. Also, each contact 26 is provided with its dependent tip 38.

The contact strip assembly 102 is most simply and inexpensively made using known sheet metal stamping and forming procedures. A problem associated with the use of such procedures, however, is that owing to the stretching of the sheet metal during the metal-cutting operation, a random amount of curvature is introduced into the strip assembly 102. This is shown (exaggerated) in FIG. 7.

The problem caused by this random curvature is that it is not possible, without more, to simultaneously align the apertures 32 of all the contacts 26 on the assembly 102 with all the leads 16 of the various stems 12 on the jig 50, all the leads 16, as shown in FIGS. 2, 5, and 10, being disposed along a straight line.

This problem is solved by bending each of the contacts 26 at right angles to the strip 100, as shown in FIGS. 8 and 9. While this has no effect upon the curvature of the material (see FIG. 8), the contacts 26 still lying along a curved surface, it does dispose all the contact apertures 32 along a straight line, as shown in FIG. 9.

The elongated strip 100 of the contact assembly 102 is then disposed between the jaws of an elongated holder 104, as shown in FIG. 10, and the holder 104 is moved towards the stems 12 (still disposed at the apparatus shown in FIG. 5, details of this apparatus not being shown in FIG. 10) to first align the contact apertures 32 of each contact 26 with a different lead 16 of each stem 12, and to then push each contact onto and downward along each lead 16 until the contact tip 38 engages, through the open end of the chute 96 (FIG. 6), the pellet 24 in contact-flexed relationship. The holder 104 then releases the contact assembly strip 102 and is withdrawn.

By virtue of the extending tongues 32 within the contact apertures 30, the contacts 26 remain mechanically locked to the leads 16, while the flexed contacts clamp the pellets 24 in place against the pedestal 20.

While, owing to the curvature of the surface in which the various contacts lie (FIG. 8), there is some variation in the height of the contacts 26 on the leads 16 and thus some variations in the amount of flexure of the contacts 26, these height variations are actually quite minor (the amount of curvature of the strip 100 being shown quite exaggerated in FIGS. 7 and 8) and have no adverse effects on the clamping of the pellets 24 against the stem pedestals 20.

The various movable plates of the apparatus shown in FIG. 5 are then retracted, and the jig 50 is then removed from the apparatus and the elongated strip 100 separated from the various amounts. This latter step is readily accomplished by providing the strip 100 with perforations where the contacts 26 join the strip, whereby a few bending twists are sufficient to break-off the strip.

What is claimed is:

1. A method of assembling a mount assembly including a stem comprising a header member and at least two leads extending therethrough, and a semiconductor pellet mounted on said header, said method comprising:

accurately positioning the header of a stem at a first apparatus work station and engaging said leads by forming tools at said station for shaping said leads to dispose an end portion of each thereof in preselected positional relationship with said header, thereafter disposing said header in loosely mounted disposition adjacent to a second apparatus work station and engaging said leads by positioning tools at said second work station for accurately positioning both said leads and said header relative to said station, disposing, at said station, an open-ended guide chute adjacent and leading to said header, and disposing a semiconductor pellet within said chute and on said header, said chute providing accurate positioning of said pellet on said header.

2. The method of claim 1 including the subsequent step of engaging one end of each of two elongated contacts with each of said leads respectively and the other ends of said contacts with said pellet through an end of said chute.

* * * * *